(12) United States Patent
Cho et al.

(10) Patent No.: US 11,258,162 B1
(45) Date of Patent: Feb. 22, 2022

(54) ANTENNA PACKAGE AND METHOD OF FORMATION THEREOF

(71) Applicant: Infineon Technologies AG, Neubiberg (DE)

(72) Inventors: Eung San Cho, Torrance, CA (US); Ashutosh Baheti, Munich (DE); Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/022,408

(22) Filed: Sep. 16, 2020

(51) Int. Cl.
*H01Q 1/38* (2006.01)
*H01Q 1/22* (2006.01)
*H01Q 9/04* (2006.01)

(52) U.S. Cl.
CPC ............. *H01Q 1/2283* (2013.01); *H01Q 1/38* (2013.01); *H01Q 9/045* (2013.01); *H01Q 9/0414* (2013.01)

(58) Field of Classification Search
CPC ...... H01Q 1/2283; H01Q 1/38; H01Q 9/0414; H01Q 9/045

USPC ......................................................... 343/702
See application file for complete search history.

(56) References Cited

U.S. PATENT DOCUMENTS

2020/0194893 A1\* 6/2020 Im .......................... H01L 23/057
2020/0403321 A1\* 12/2020 Kang ................... H01Q 1/2283

\* cited by examiner

*Primary Examiner* — Peguy Jean Pierre
(74) *Attorney, Agent, or Firm* — Slater Matsil, LLP

(57) ABSTRACT

A semiconductor system includes a semiconductor chip comprising a RF circuit, a buffer layer over the RF circuit and a plurality of bumps over the buffer layer, wherein the plurality of bumps comprising at least one functional bump electrically connected to the RF circuit, and at least one dummy bump which is maintained at a distance from the RF circuit and prevented from being electrically connected to the RF circuit by the buffer layer, a conductive layer disposed over the semiconductor chip and coupled to the plurality of bumps through a plurality of vias, a feedline structure disposed over the conductive layer, wherein the feedline structure is electrically coupled to the RF circuit, and a plurality of antennas disposed over the feedline structure, wherein at least one antenna of the plurality of antennas is coupled to the RF circuit through the feedline structure.

20 Claims, 15 Drawing Sheets

ANTENNA PACKAGE AND METHOD OF FORMATION THEREOF

TECHNICAL FIELD

The present invention relates generally to radio frequency semiconductor devices, and in particular embodiments, to antenna-in-package (AiP) semiconductor devices.

BACKGROUND

Since the invention of the integrated circuit, the semiconductor industry has experienced rapid growth due to continuous improvements in the integration density of various electronic components. The improvement in integration density has come from continuous reductions in minimum feature size. The reduced feature size allows more components to be integrated into a given semiconductor area. As the demand for further reducing the size of the electronic device has grown recently, there has grown a need for more creative packaging techniques of semiconductor dies.

As semiconductor technologies evolve, fan-out wafer-level packaging has emerged as an effective alternative to further reduce the physical size of a semiconductor chip. In a semiconductor device having a fan-out signal routing layout, the input and output pads of a semiconductor die can be redistributed to an area outside the area under the semiconductor die. As such, the input and output pads can spread signals to a larger area than the area under the semiconductor die and provide additional space for interconnects. As a result of having the fan-out signal routing layout, the number of input and output pads of the semiconductor device can be increased.

In a fan-out wafer-level package, the semiconductor die may comprise radio-frequency integrated circuits (RFICs). An example of such a semiconductor device is an antenna-in-package (AiP) device. The AiP device includes an RFIC and an antenna. The RFIC and the antenna are included in a same package. The AiP device allows integration of RF components (e.g., an antenna) with active circuits (e.g., RFIC) into a same module. The AiP device is able to reduce the footprint of a radio frequency semiconductor device.

In some high frequency applications such as RFICs operating at millimeter wave frequencies, a variety of challenges exist. For example, RF shielding has become more challenging for millimeter wave applications. It is desirable to have enhanced RF shielding to further improve the performance of the RFICs.

SUMMARY

In accordance with an embodiment, a semiconductor device comprises a radio frequency (RF) circuit, a plurality of antennas, a feedline structure for coupling at least one antenna of the plurality of antennas to the RF circuit, an input/output (I/O) structure for connecting the semiconductor device to an external apparatus, and a conductive layer connected to the I/O structure, wherein the semiconductor device further comprises a buffer layer arranged between the RF circuit and the conductive layer, and a plurality of bumps disposed over the buffer layer and electrically connected to the conductive layer, the plurality of bumps comprising at least one functional bump electrically connected to the RF circuit, and at least one dummy bump which is maintained at a distance from the RF circuit and prevented from being electrically connected to the RF circuit by the buffer layer.

In accordance with another embodiment, a method comprises forming a semiconductor chip comprising a radio frequency (RF) circuit, a buffer layer over the RF circuit, a plurality of bumps over the buffer layer, wherein the plurality of bumps comprising at least one functional bump electrically connected to the RF circuit, and at least one dummy bump separated from the RF circuit by the buffer layer, forming a conductive layer over the semiconductor chip, forming a plurality of vias coupled between the plurality of bumps and the conductive layer, forming a feedline structure over the conductive layer, and forming a plurality of antennas over the feedline structure, wherein at least one antenna of the plurality of antennas is coupled to the RF circuit through the feedline structure.

In accordance with yet another embodiment, a semiconductor system comprises a semiconductor chip comprising a RF circuit, a buffer layer over the RF circuit and a plurality of bumps over the buffer layer, wherein the plurality of bumps comprising at least one functional bump electrically connected to the RF circuit, and at least one dummy bump which is maintained at a distance from the RF circuit and prevented from being electrically connected to the RF circuit by the buffer layer, a conductive layer disposed over the semiconductor chip and coupled to the plurality of bumps through a plurality of vias, a feedline structure disposed over the conductive layer, wherein the feedline structure is electrically coupled to the RF circuit, and a plurality of antennas disposed over the feedline structure, wherein at least one antenna of the plurality of antennas is coupled to the RF circuit through the feedline structure.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an antenna-in-package (AiP) semiconductor device. The present disclosure may also be applied, however, to a variety of radio frequency semiconductor devices. Hereinafter, various embodiments will be explained in detail with reference to the accompanying drawings.

Figure 1:
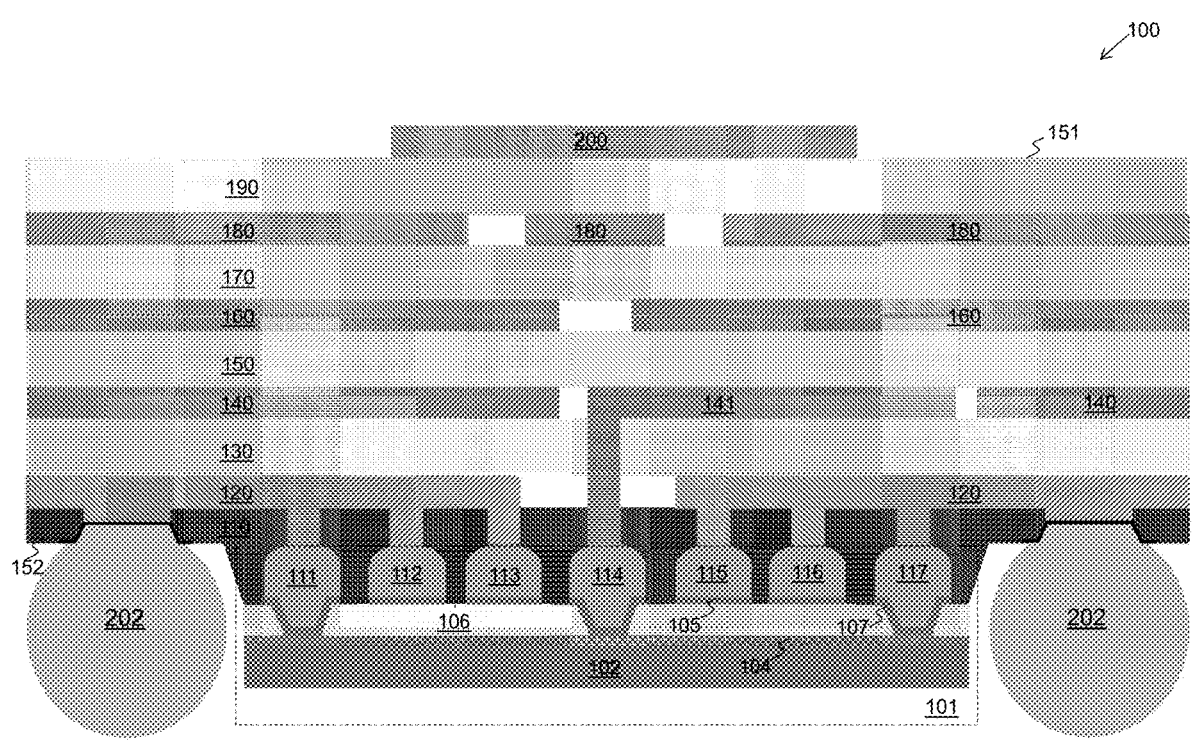
FIG. 1 illustrates a cross sectional view of an AiP device in accordance with various embodiments of the present disclosure.

FIG. 1 illustrates a cross sectional view of an AiP device in accordance with various embodiments of the present disclosure. The AiP device 100 comprises a top side 151 and a bottom side 152 as shown in FIG. 1. A semiconductor chip 101 is mounted on the bottom side 152. The semiconductor chip 101 comprises a radio frequency integrated circuit (RFIC). One or more antennas 200 are formed over the top side 151. A plurality of conductive layers (e.g., 120, 140, 160 and 180) and laminate layers (e.g., 130, 150, 170 and 190) are formed between the semiconductor chip 101 and the antennas 200. Throughout the description, the antennas 200 may be alternatively referred to as a plurality of antennas. As shown in FIG. 1, the plurality of conductive layers and the plurality of laminate layers are arranged in an alternating manner. An underfill layer 110 is formed between the semiconductor chip 101 and a conductive layer (e.g., first conductive layer 120). Throughout the description, the AiP device 100 may be alternatively referred to as a semiconductor device. The AiP device 100 further comprises an input/output (I/O) structure (e.g., 202 shown in FIG. 1).

As shown in FIG. 1, a plurality of input/output pads 202 is mounted on the bottom side 152 of the semiconductor device 100. The plurality of input/output pads 202 may be electrically connected to at least one of the plurality of conductive layers (e.g., first conductive layer 120). The plurality of input/output pads 202 forms the input/output structure for the semiconductor device 100. The input/output structure is configured to connecting the semiconductor device 100 to an external apparatus (not shown).

In some embodiments, at least one conductive layer comprises a feedline structure for coupling at least one antenna of the plurality of antennas 200 to the RFIC in the semiconductor chip 101. As shown in FIG. 1, the feedline structure 141 is coupled to the RFIC of the semiconductor chip 101. In some embodiments, the feedline structure 141 is surrounded by a conductive layer, such as conductive layer 140. For instance, the feedline structure 141 comprises or consists of a layer portion (as shown in FIG. 1), which stretches over only part of the width of the AiP device 100. The conductive layer 140 is substantially coplanar with the layer portion and is arranged so as to surround at least partially the layer portion. This arrangement of the conductive layer 140 functions as a RF shielding layer. The detailed structures of the feedline structure 141 and the conductive layer 140 will be described below with respect to FIGS. 8-11.

The semiconductor chip 101 comprises a substrate portion 102 and an interconnect portion over the substrate portion. The substrate portion 102 of the semiconductor chip 101 may comprise a plurality of active circuits (e.g., RFIC). Throughout the description, RFIC may be alternatively referred to as a RF circuit. The interconnect portion of the semiconductor chip 101 may comprise a passivation layer 104, a buffer layer 106, a plurality of under bump metallization (UBM) structures and a plurality of metal features such as bumps 111-117. The buffer layer 106 is between the RF circuit and the conductive layer (e.g., first conductive layer 120). The bumps 111-117 are disposed over the buffer layer 106. The bumps 111-117 are electrically coupled to the first conductive layer 120 through a plurality of vias extending through the underfill layer 110.

In some embodiments, bumps 111, 114 and 117 are functional bumps. As shown in FIG. 1, the functional bumps are formed on their respective first UBM structures 107. The functional bumps 111, 114 and 117 extend into the buffer layer 106. At least one functional bump is electrically connected to the RF circuit.

In some embodiments, bumps 112, 113, 115 and 116 are dummy bumps. As shown in FIG. 1, the dummy bumps are formed on their respective second UBM structures 105. The dummy bumps are formed over the top surface of the buffer layer 106. As shown in FIG. 1, a bottom surface of the functional bumps is lower than a bottom surface of the dummy bumps. Furthermore, the functional bumps are partially embedded in the buffer layer 106 of the semiconductor chip 101. The dummy bumps are over the buffer layer 106 of the semiconductor chip 101. As shown in FIG. 1, at least one dummy bump (e.g., dummy bump 115) is maintained at a distance from the RF circuit. The at least one dummy bump is prevented from being electrically connected to the RF circuit by the buffer layer 106.

In some embodiments, the first UBM structure 107 and the second UBM structure 105 are formed from a same metal patterning process. The metal patterning process includes forming a metal layer over the buffer layer 106 of the semiconductor chip 101, and patterning the metal layer to form a plurality of UBM structures including the first UBM structure 107 under the functional bump and the second UBM structure 105 under the dummy bump. As shown in FIG. 1, the first UBM structure 107 extends into the buffer layer 106. The second UBM structure 105 is over the buffer layer 106.

The first UBM structure 107 and the second UBM structure 105 are formed of a same material. Furthermore, the first UBM structure 107 and the second UBM structure 105 are of a same thickness. In some embodiments, the first UBM structure 107 and the second UBM structure 105 are of a thickness of about 5 micrometers. The detailed structure of the semiconductor chip 101 will be described below with respect to FIG. 2.

It should be noted that FIG. 1 illustrates only three functional bumps and four dummy bumps of the semiconductor chip 101 that may include hundreds of such functional/dummy bumps. The number of functional/dummy bumps illustrated herein is limited solely for the purpose of clearly illustrating the inventive aspects of the various embodiments. The present disclosure is not limited to any specific number of functional/dummy bumps.

In conventional AiP devices, bumps or dummy bumps of a semiconductor chip are placed on top of openings in the buffer layer. In contrast, the dummy bumps shown in FIG. 1 are on top of the buffer layer 106. Furthermore, the second UBM structure 105 functions as an added passivation layer. This added passivation layer is able to provide additional RF shielding for the AiP device.

One advantageous feature of having dummy pumps and their associated UBM structures is that the second UBM structures 105 shown in FIG. 1 provide additional RF shielding. The additional RF shielding helps to further improve the RF performance of the AiP device 100. The formation processes of the AiP device 100 will be described in detail with respect to FIGS. 11-14.

FIGS. 2-14 illustrate intermediate steps of fabricating the AiP device shown in FIG. 1 in accordance with various embodiments of the present disclosure. It should be noted that the fabrication steps as well as the structure of the AiP device shown in FIGS. 2-14 are merely an example. A person skilled in the art will recognize there may be many alternatives, variations and modifications.

Figure 2:
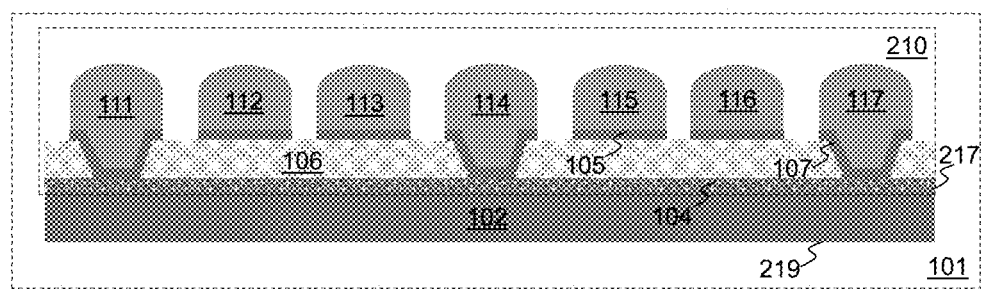
FIG. 2 illustrates a cross sectional view of the semiconductor chip shown in FIG. 1 in accordance with various embodiments of the present disclosure.

FIG. 2 illustrates a cross sectional view of the semiconductor chip shown in FIG. 1 in accordance with various embodiments of the present disclosure. The semiconductor chip 101 comprises a substrate portion 102 and an interconnect portion 210 formed over the substrate portion 102. The interconnect portion 210 comprises a passivation layer 104, a buffer layer 106, a plurality of first UBM structures 107 formed in the buffer layer 106, a plurality of second UBM structures 105 formed over the buffer layer 106, functional bumps 111, 114 and 117, and dummy bumps 112, 113, 115 and 116.

As shown in FIG. 2, the interconnect portion 210 of the semiconductor chip 101 is over and in contact with a first side 217 of the substrate portion 102. The first side 217 of the substrate portion 102 is adjacent to the active circuits of the substrate portion 102. A second side 219 of the substrate portion 102 is opposite to the first side 217. Throughout the description, the first side 217 of the substrate portion 102 is alternatively referred to as a front side of the substrate portion 102. The second side 219 the substrate portion 102 is alternatively referred to as a backside of the substrate portion 102.

In some embodiments, the interconnect portion 210 of the semiconductor chip 101 comprises a plurality of bumps. It should be noted while FIG. 2 illustrates four dummy bumps (e.g., dummy bump 112) and three functional bumps (e.g., functional bump 111) are in the interconnect portion 210, other suitable interconnect elements such as vias, metal lines, redistribution lines and the like may be formed in the interconnect portion 210 depending on different design needs and applications.

The passivation layer 104 is formed over the substrate portion 102. The passivation layer 104 may be formed of a nitride such as silicon nitride or the like. Alternatively, the passivation layer 104 may be formed of an oxide such as silicon oxide or the like. The passivation layer 104 may be formed by a suitable fabrication process such as chemical vapor deposition (CVD) or the like.

The buffer layer 106 is formed over the passivation layer 104. The buffer layer 106 may be formed of a polymer such as PBO, polyimide, BCB or the like. The buffer layer 106 may be formed by any suitable fabrication processes such as spin coating, lamination, CVD or the like. In some embodiments, the buffer layer 106 is of a thickness in a range from about 5 micrometers to about 20 micrometers.

The bumps 111-117 are formed over the buffer layer 106. The bumps 111-117 may be formed by any suitable fabrication processes such as plating or the like. The functional bumps 111, 114 and 117 are electrically coupled to the RF circuit of the semiconductor chip 101. The dummy bumps 112, 113, 115 and 116 are maintained at a distance from the RF circuit of the semiconductor chip 101. The dummy bumps 112, 113, 115 and 116 are prevented from being electrically connected to the RF circuit by the buffer layer 106.

It should be noted that the semiconductor chip 101 is drawn without details. The semiconductor chip 101 may comprise a substrate, active circuits (e.g., RFIC), a plurality of inter-layer dielectric (ILD) layers and inter-metal dielectric (IMD) layers.

The substrate of the semiconductor chip 101 may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The active circuits formed on the substrate may be any type of circuitry suitable for a particular application. In accordance with an embodiment, the active circuits may include various n-type metal-oxide semiconductor (NMOS) and/or p-type metal-oxide semiconductor (PMOS) devices such as transistors, capacitors, resistors, diodes, photo-diodes, fuses and/or the like. The active circuits may be interconnected to perform one or more functions. The functions may include radio frequency circuits, memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

Figure 3:
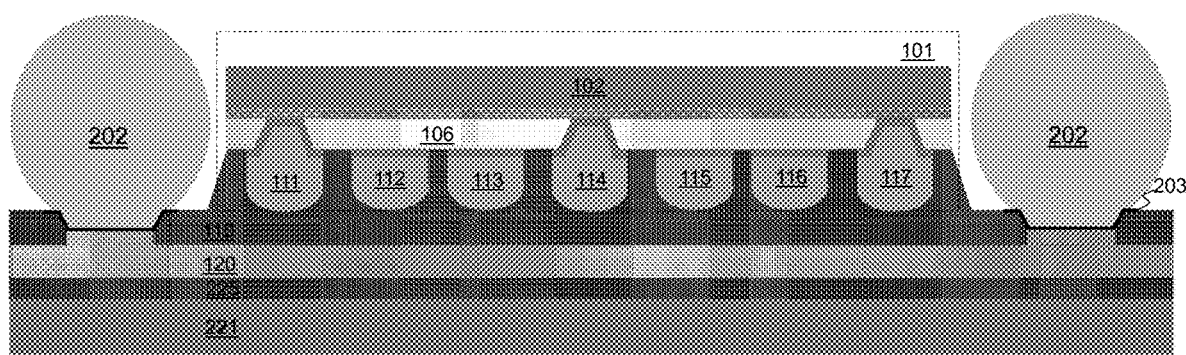
FIG. 3 illustrates a cross sectional view of the semiconductor device after the semiconductor chip has been mounted on a carrier in accordance with various embodiments of the present disclosure.

FIG. 3 illustrates a cross sectional view of the semiconductor device after the semiconductor chip has been mounted on a carrier in accordance with various embodiments of the present disclosure. The carrier 221 may be formed of silicon, glass, ceramic aluminum oxide, silicon oxide, any combinations thereof and/or the like. A release layer 225 is formed over the carrier 221. In some embodiments, the release layer 225 is formed of an epoxy-based thermal-release material. In alternative embodiments, the release layer 225 may be formed of an ultra-violet (UV) glue, which loses its adhesive property when exposed to UV lights. Furthermore, the release layer 225 may be formed of a light-to-heat conversion layer, which loses its adhesive property after the release layer has been exposed to laser light.

A first conductive layer 120 is formed over the carrier 221 as shown in FIG. 3. The first conductive layer 120 may be formed of any suitable conductive materials such as copper. The first conductive layer 120 may be made by any suitable method known in the art such as physical vapor deposition (PVD), sputter, CVD, electroplating and/or the like.

The semiconductor chip 101 is attached to the first conductive layer 120 using an underfill layer 110. As shown in FIG. 3, the front side of the semiconductor chip 101 is mounted over the carrier 221. The bumps 111-117 are embedded in the underfill layer 110.

It should be noted that while FIG. 3 illustrates a single semiconductor chip mounted on the carrier 221, the carrier 221 may accommodate any number of semiconductor chips.

As shown in FIG. 3, the underfill layer 110 may fill the gap between the front side of the semiconductor chip 101 and the first conductive layer 120. More particularly, the underfill layer 110 is disposed between the buffer layer 106 and the conductive layer (e.g., the first conductive layer 120). In some embodiments, the underfill layer 110 may be formed of an epoxy, which is dispensed at the gap between the front side of the semiconductor chip 101 and the first conductive layer 120. The epoxy may be applied in a liquid form, and may harden after a curing process. In alternative embodiments, the underfill layer 110 may be formed of curable materials such as polymer based materials, resin based materials, polyimide, epoxy and any combinations of thereof. The underfill layer 110 can be formed by any suitable dispense techniques.

A first input/output pad and a second input/output pad 202 are formed on the UBMs 203. The semiconductor chip 101 including the RF circuit is placed between the first input/output pad and a second input/output pad as shown in FIG. 3. Throughout the description, the first input/output pad and the second input/output pad 202 may be alternatively referred to as bumps.

In some embodiments, the input/output pads 202 may be solder balls as shown in FIG. 3. Alternatively, the input/output pads 202 may be implemented as other suitable input/output connectors such as metal pillars, controlled collapse chip connection (C4) bumps, micro bumps and the like. The input/output pads 202 may include a conductive material such as solder, copper, aluminum, gold, nickel, silver, palladium, tin, the like, or a combination thereof. In some embodiments, the input/output pads 202 are formed by initially forming a layer of solder through such commonly used methods such as evaporation, electroplating, printing or the like. Once a layer of solder has been formed, a reflow may be performed in order to shape the material into the desired bump shapes.

Figure 4:
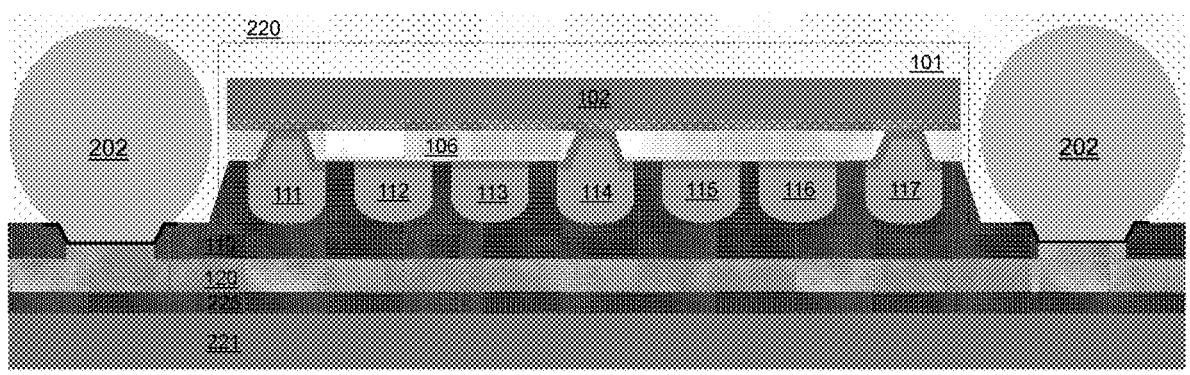
FIG. 4 illustrates a cross sectional view of the semiconductor device shown in FIG. 3 after forming a dielectric layer over the semiconductor device in accordance with various embodiments of the present disclosure.

FIG. 4 illustrates a cross sectional view of the semiconductor device shown in FIG. 3 after forming a dielectric layer over the semiconductor device in accordance with various embodiments of the present disclosure. In some embodiments, the dielectric layer 220 is formed of suitable dielectric materials such as epoxy resin, glass fiber (e.g., pre-preg), mold compound materials and the like. In some embodiments, the dielectric layer 220 is a molding compound layer. The molding compound layer 220 may be formed of epoxy based resins and the like. Alternatively, the molding compound layer 220 may be replaced by photo-sensitive materials including polybenzoxazole (PBO), SU-8 photo-sensitive epoxy, film type polymer materials and/or the like. Throughout the description, the dielectric layer 220 may be alternatively referred to as a molding compound layer. In accordance with an embodiment, the molding compound layer 220 is either laminated or coated over the semiconductor device.

Figure 5:
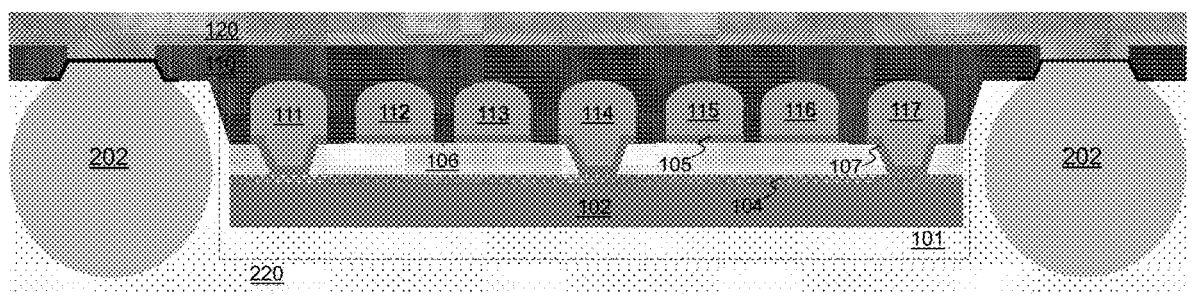
FIG. 5 illustrates a cross sectional view of the semiconductor device shown in FIG. 4 after the carrier has been removed in accordance with various embodiments of the present disclosure.

FIG. 5 illustrates a cross sectional view of the semiconductor device shown in FIG. 4 after the carrier has been removed in accordance with various embodiments of the present disclosure. The carrier 221 shown in FIG. 4 can be detached from the semiconductor device. A variety of detaching processes may be employed to separate the semiconductor device from the carrier 221. The variety of detaching processes may comprise a chemical solvent, a UV exposure, a laser de-bonding process and the like. The release layer 225 may be removed from the semiconductor device by using a suitable etching process such as a wet cleaning process.

Figure 6:
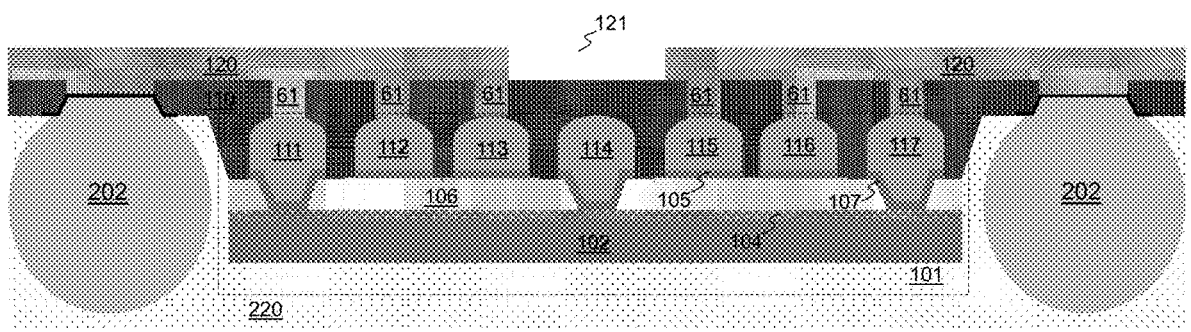
FIG. 6 illustrates a cross sectional view of the semiconductor device shown in FIG. 5 after a patterning process is applied to the first conductive layer in accordance with various embodiments of the present disclosure.

FIG. 6 illustrates a cross sectional view of the semiconductor device shown in FIG. 5 after a patterning process is applied to the first conductive layer in accordance with various embodiments of the present disclosure. The first conductive layer 120 is patterned through suitable fabrication processes. Subsequently, vias 61 are formed in the underfill layer 110 and the first conductive layer 120, and an opening 121 is formed in the first conductive layer 120. The vias 61 may couple the first conductive layer 120 to the RFIC of the semiconductor chip 101 through the functional bumps 111 and 117.

The patterning process of the first conductive layer 120 may be implemented by using suitable patterning techniques such as an etching process, a laser ablation/laser drilling process and/or the like.

Figure 7:
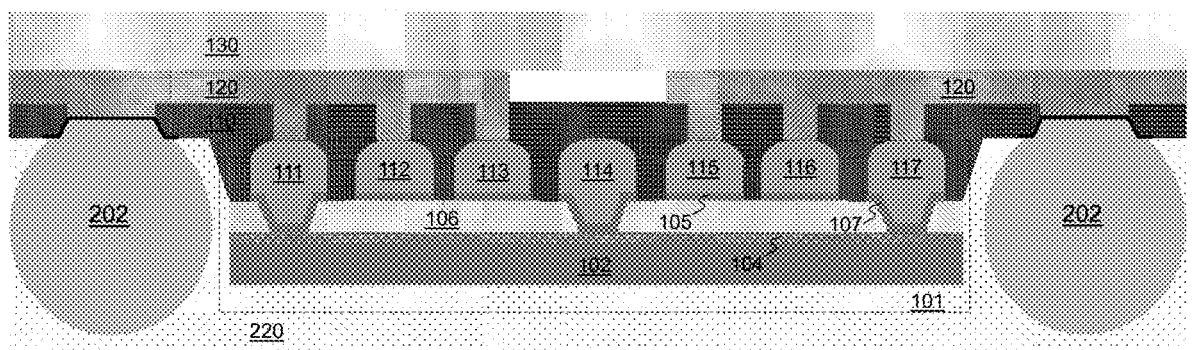
FIG. 7 illustrates a cross sectional view of the semiconductor device shown in FIG. 6 after a first laminate layer is formed over the first conductive layer in accordance with various embodiments of the present disclosure.

FIG. 7 illustrates a cross sectional view of the semiconductor device shown in FIG. 6 after a first laminate layer is formed over the first conductive layer in accordance with various embodiments of the present disclosure. The first laminate layer 130 may be formed of a low-loss high frequency material such as a woven glass reinforced hydrocarbon ceramic, polytetrafluoroethylene (PTFE) and the like. In alternative embodiments, the first laminate layer 130 may be commercial laminate material manufactured with copper cladding on one or both surfaces.

Figure 8:
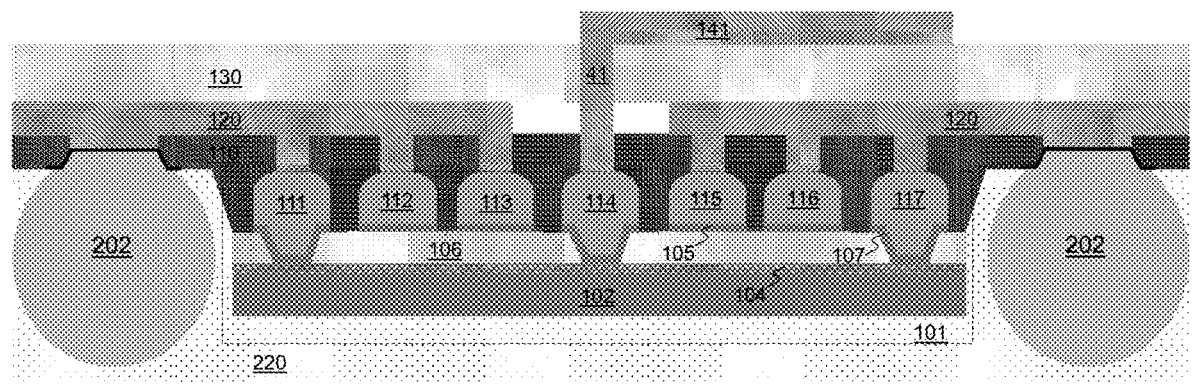
FIG. 8 illustrates a cross sectional view of the semiconductor device shown in FIG. 7 after a feedline structure is formed over the first laminate layer in accordance with various embodiments of the present disclosure.

FIG. 8 illustrates a cross sectional view of the semiconductor device shown in FIG. 7 after a feedline structure is formed over the first laminate layer in accordance with various embodiments of the present disclosure. A conductive layer is formed over the first laminate layer 130. The conductive layer is patterned to form the feedline structure 141. Via 41 may be formed extending from the conductive layer through the first laminate layer 130 and the underfill layer 110. As shown in FIG. 8, the feedline structure 141 is electrically coupled to the RF circuit of the semiconductor chip 101 through the via 41. The via 41 extends through the opening of the first conductive layer 120. The opening in the first conductive layer 120 may be used to prevent the via 41 from contacting the first conductive layer 120.

Figure 9:
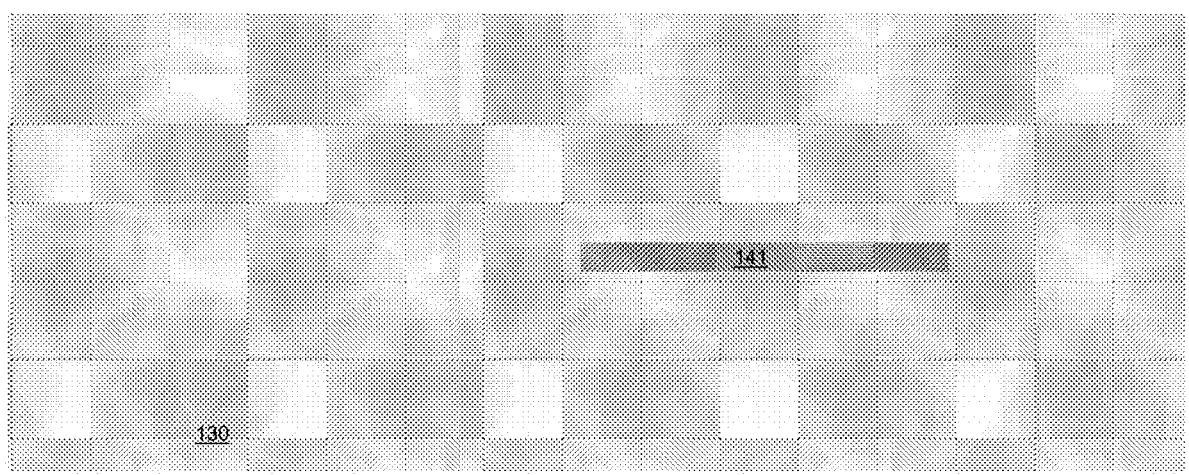
FIG. 9 illustrates a top view of the semiconductor device shown in FIG. 8 in accordance with various embodiments of the present disclosure.

FIG. 9 illustrates a top view of the semiconductor device shown in FIG. 8 in accordance with various embodiments of the present disclosure. The feedline structure 141 is formed over the first laminate layer 130. As shown in FIG. 9, the feedline structure 141 is rectangular in shape. In operation, RF signals generated by the RFIC flow through the feedline structure 141 and reach the antennas 200.

It should be noted that while FIG. 9 shows the feedline structure 141 is substantially rectangular in shape, it is merely an example. It is within the scope and spirit of the disclosure for the feedline structure 141 to comprise other shapes, such as, but not limited to oval, square, or circular. Furthermore, depending on different applications and design needs, the shape as well as the dimension of the feedline structure 141 may vary accordingly. For example, the shape and/or the dimension of the feedline structure 141 may be modified to accommodate different RF communication frequencies.

Figure 10:
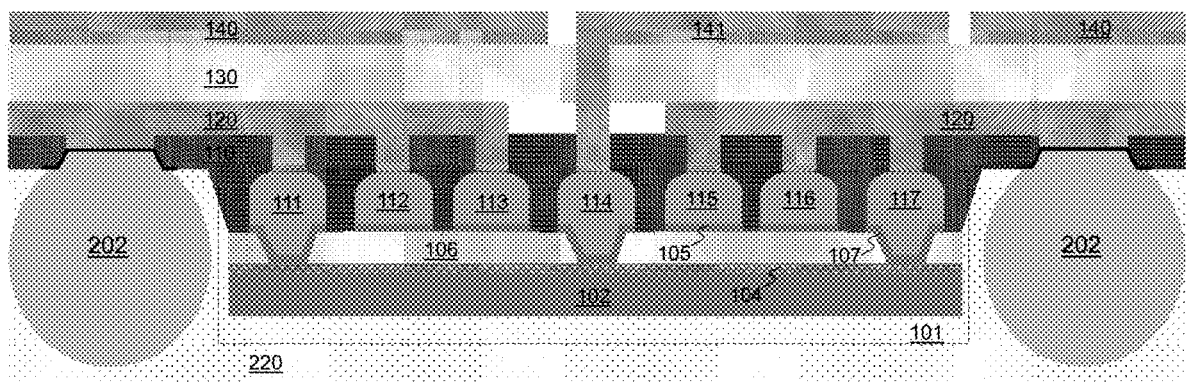
FIG. 10 illustrates a cross sectional view of the semiconductor device after forming a shielding layer in accordance with various embodiments of the present disclosure.

FIG. 10 illustrates a cross sectional view of the semiconductor device after forming a shielding layer in accordance with various embodiments of the present disclosure. The shielding layer 140 is formed over the first laminate layer 130. The shielding layer 140 may be formed of any suitable conductive materials such as copper. The shielding layer 140 may be made by any suitable method known in the art such as PVD, sputter, CVD, electroplating and/or the like.

Referring back to FIG. 9, before forming the shielding layer 140, the feedline structure 141 is the only conductive element over the first laminate layer 130. The shielding layer 140 is formed to occupy the used area surrounding the feedline structure 141. As a result of forming the shielding layer 140, the feedline structure 141 is at least partially surrounded by a metal shielding layer (shown in FIG. 11).

One advantageous feature of having the shielding layer 140 is the shielding layer provides RF shielding for the feedline structure 141 to improve the RF signal integrity, thereby achieving better system performance.

It should be noted that the fabrication step shown in FIG. 10 is merely an example, which should not unduly limit the scope of the claims. One of ordinary skill in the art would recognize many variations, alternatives, and modifications. For example, the fabrication step shown in FIG. 10 may be combined with the step shown in FIG. 8. In other words, the feedline structure 141 and shielding layer 140 may be formed in a single fabrication step.

Figure 11:
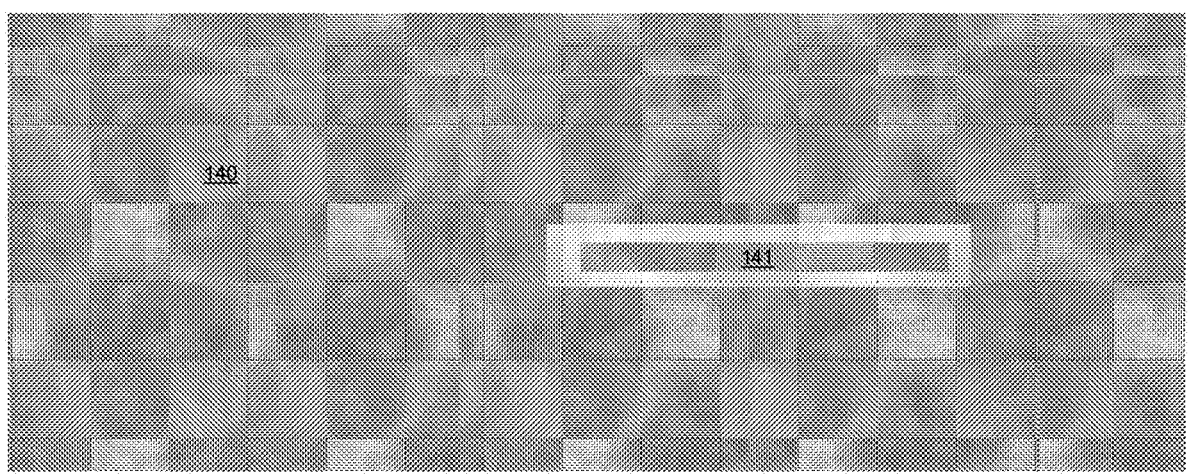
FIG. 11 illustrates a top view of the semiconductor device shown in FIG. 10 in accordance with various embodiments of the present disclosure.

FIG. 11 illustrates a top view of the semiconductor device shown in FIG. 10 in accordance with various embodiments of the present disclosure. After forming the shielding layer 140, the feedline structure 141 is surrounded by the shielding layer 140. In other words, the shielding layer 140 covers all of the remaining area over the first laminate layer 130 for improving RF shielding.

Figure 12:
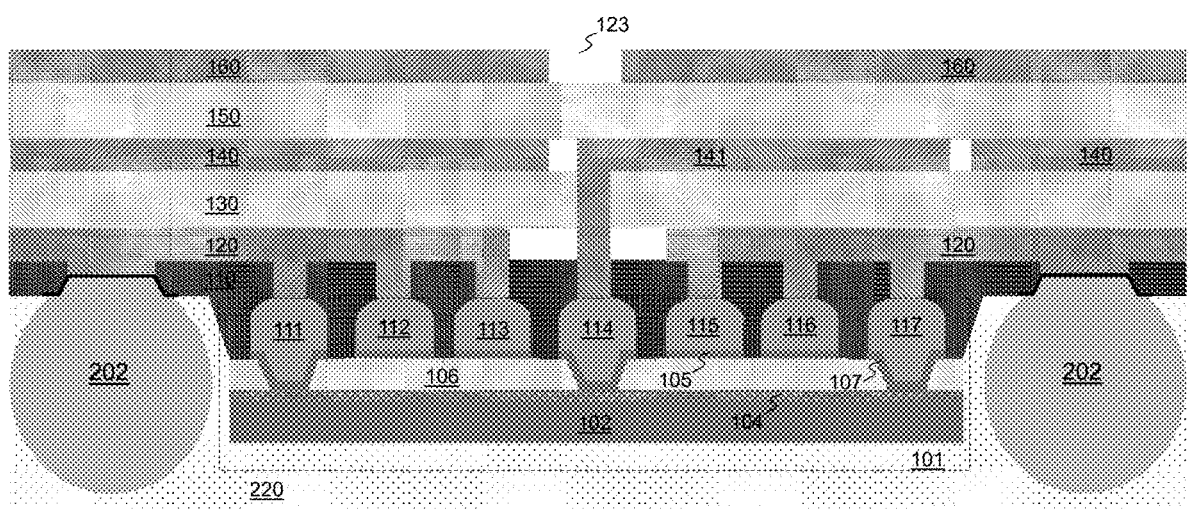
FIG. 12 illustrates a cross sectional view of the semiconductor device shown in FIG. 10 after forming a second laminate layer and a second conductive layer in accordance with various embodiments of the present disclosure.

FIG. 12 illustrates a cross sectional view of the semiconductor device shown in FIG. 10 after forming a second laminate layer and a second conductive layer in accordance with various embodiments of the present disclosure. The second laminate layer 150 and the second conductive layer 1600 are formed over the feedline structure 141 using previously described processes for laminate layers and conductive layers. Also as previously described, the second conductive layer 160 may be patterned to form an opening 123. In some embodiments, the second conductive layer 1600 may be a ground layer which may facilitate the transfer of electromagnetic signals.

Figure 13:
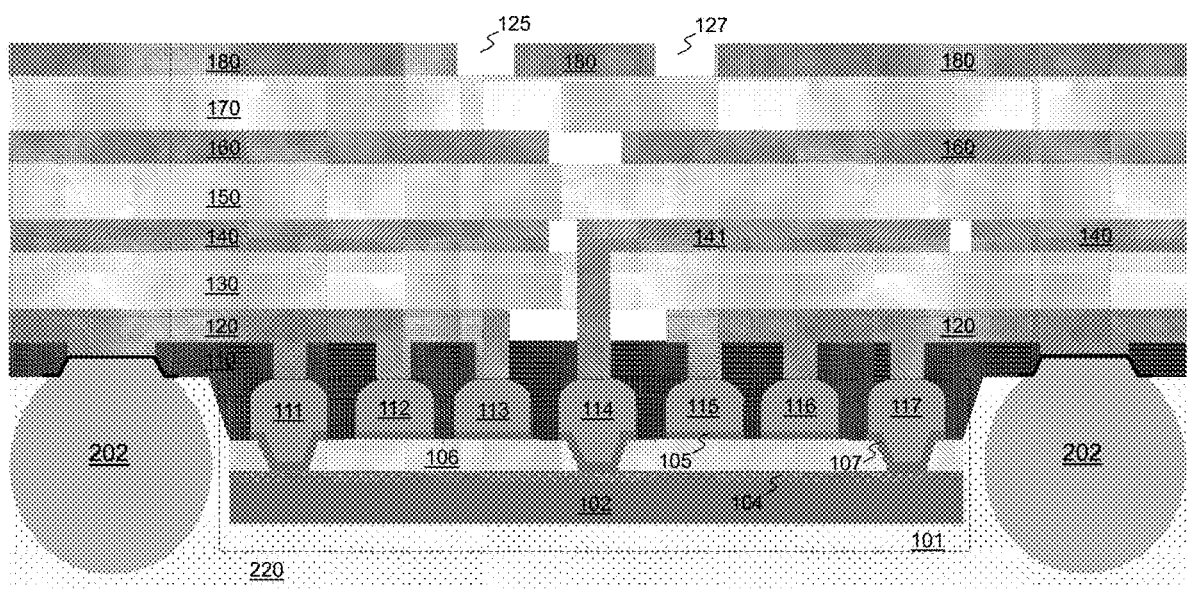
FIG. 13 illustrates a cross sectional view of the semiconductor device shown in FIG. 12 after forming a third laminate layer and a third conductive layer in accordance with various embodiments of the present disclosure.

FIG. 13 illustrates a cross sectional view of the semiconductor device shown in FIG. 12 after forming a third laminate layer and a third conductive layer in accordance with various embodiments of the present disclosure. The third laminate layer 170 and the third conductive layer 180 are formed over the second conductive layer 160 using previously described processes for laminate layers and conductive layers. Also as previously described, the third conductive layer 180 may be patterned to form openings 125 and 127. In some embodiments, the third conductive layer 180 may be a ground layer which may facilitate the transfer of electromagnetic signals.

Figure 14:
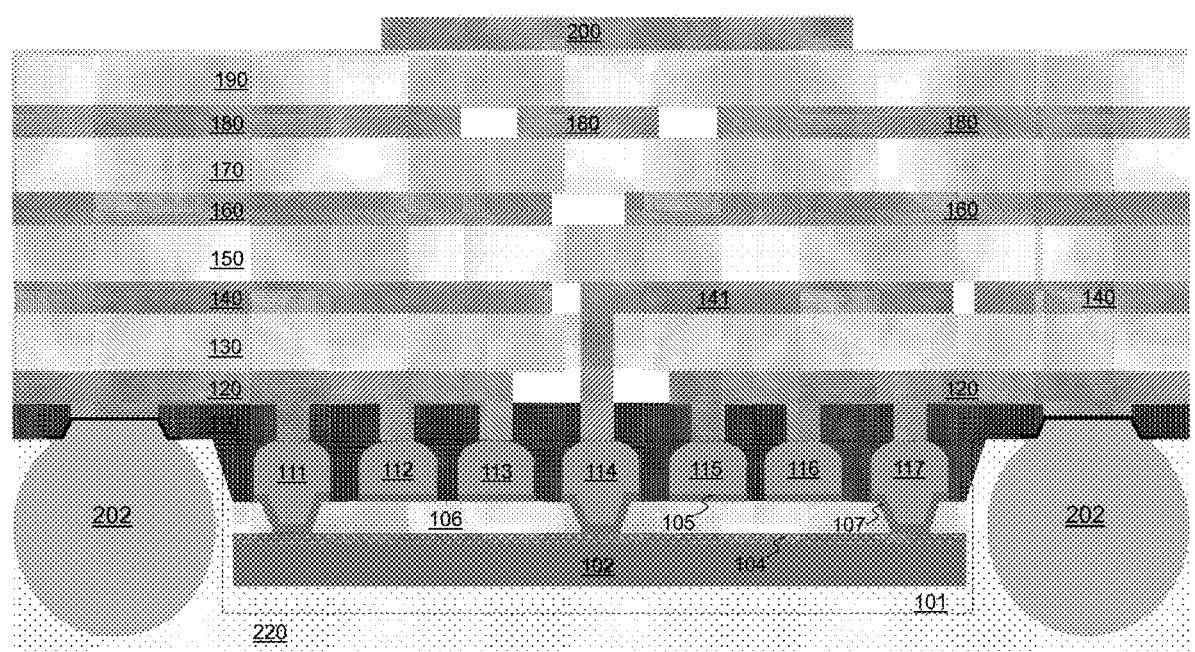
FIG. 14 illustrates a cross sectional view of the semiconductor device shown in FIG. 13 after forming a fourth laminate layer and an antenna layer in accordance with various embodiments of the present disclosure.

FIG. 14 illustrates a cross sectional view of the semiconductor device shown in FIG. 13 after forming a fourth laminate layer and an antenna layer in accordance with various embodiments of the present disclosure. The fourth laminate layer 190 and the antenna layer are formed over the third conductive layer 180 using previously described processes for laminate layers and conductive layers such. The antenna layer is then patterned to form the plurality of antennas 200. In some embodiments, the antennas 200 are aligned vertically with the openings in the third conductive layer 180.

It should be noted that the molding compound layer 220 may be removed from the semiconductor device by using a suitable etching process such as a wet cleaning process.

Figure 15:
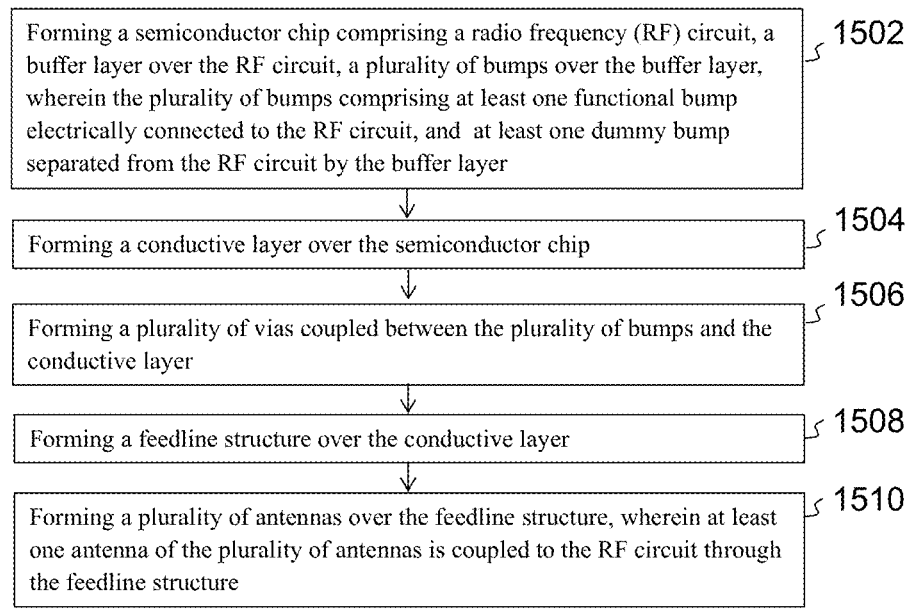
FIG. 15 illustrates a flow chart of a method for fabricating the AiP device shown in FIG. 1 in accordance with various embodiments of the present disclosure.

FIG. 15 illustrates a flow chart of a method for fabricating the AiP device shown in FIG. 1 in accordance with various embodiments of the present disclosure. This flowchart shown in FIG. 15 is merely an example, which should not unduly limit the scope of the claims. One of ordinary skill in the art would recognize many variations, alternatives, and modifications. For example, various steps illustrated in FIG. 15 may be added, removed, replaced, rearranged and repeated.

At step 1502, a semiconductor chip is formed. The semiconductor chip comprises a RF circuit, a buffer layer over the RF circuit, a plurality of bumps over the buffer layer. The plurality of bumps comprises at least one functional bump, and at least one dummy bump. The functional bump is electrically connected to the RF circuit. The dummy bump is separated from the RF circuit by the buffer layer.

At step 1504, a conductive layer is formed over the semiconductor chip. An underfill layer is formed between the conductive layer and the semiconductor chip.

At step 1506, a plurality of vias is formed. The vias are coupled between the plurality of bumps and the conductive layer. The conductive layer is coupled to the RF circuit through the vias and the functional bumps.

At step 1508, a feedline structure is formed over the conductive layer. The feedline structure is coupled to the RF circuit through a via and a functional bump. The via extends through an opening in the conductive layer.

At step 1510, a plurality of antennas is formed over the feedline structure. At least one antenna of the plurality of antennas is coupled to the RF circuit through the feedline structure.

Embodiments of the present invention are summarized here. Other embodiments can also be understood from the entirety of the specification and the claims filed herein.

Example 1. A semiconductor device including: a radio frequency (RF) circuit, a plurality of antennas, a feedline structure for coupling at least one antenna of the plurality of antennas to the RF circuit, an input/output (I/O) structure for connecting the semiconductor device to an external apparatus, and a conductive layer connected to the I/O structure, wherein the semiconductor device further comprises a buffer layer arranged between the RF circuit and the conductive layer, and a plurality of bumps disposed over the buffer layer and electrically connected to the conductive layer, the plurality of bumps comprising at least one functional bump electrically connected to the RF circuit, and at least one dummy bump which is maintained at a distance from the RF circuit and prevented from being electrically connected to the RF circuit by the buffer layer.

Example 2. The semiconductor device of example 1, further including: a first under bump metallization (UBM) structure under the at least one functional bump, and a second UBM structure under the at least one dummy bump, wherein the first UBM structure and the second UBM structure are formed of a same material.

Example 3. The semiconductor device of example 2, where the first UBM structure and the second UBM structure are of a same thickness.

Example 4. The semiconductor device of one of examples 1 to 3, further including: an underfill layer disposed between the buffer layer and the conductive layer.

Example 5. The semiconductor device of one of examples 1 to 4, where the I/O structure comprises a first input/output pad and a second input/output pad electrically coupled to the conductive layer, and wherein the RF circuit is between the first input/output pad and the second input/output pad.

Example 6. The semiconductor device of one of examples 1 to 5, where the conductive layer comprises a first opening, and wherein the feedline structure is electrically coupled to the RF circuit through a first via, and wherein the first via extends through the first opening.

Example 7. The semiconductor device of one of examples 1 to 6, where the feedline structure is at least partially surrounded by a metal shielding layer.

Example 8. The semiconductor device of one of examples 1 to 7, where a bottom surface of the at least one functional bump is lower than a bottom surface of the at least one dummy bump.

Example 9. A method including: forming a semiconductor chip comprising a radio frequency (RF) circuit, a buffer layer over the RF circuit, a plurality of bumps over the buffer layer, wherein the plurality of bumps comprising at least one functional bump electrically connected to the RF circuit, and at least one dummy bump separated from the RF circuit by the buffer layer, forming a conductive layer over the semiconductor chip, forming a plurality of vias coupled between the plurality of bumps and the conductive layer, forming a feedline structure over the conductive layer, and forming a plurality of antennas over the feedline structure, wherein at least one antenna of the plurality of antennas is coupled to the RF circuit through the feedline structure.

Example 10. The method of example 9, further including: forming a metal shielding layer to at least partially surround the feedline structure.

Example 11. The method of one of examples 9-10, further including: forming a metal layer over the buffer layer of the semiconductor chip, and patterning the metal layer to form a plurality of UBM structures including a first UBM structure under the at least one functional bump and a second UBM structure under the at least one dummy bump.

Example 12. The method of example 11, where the first UBM structure extends into the buffer layer and the second UBM structure is over the buffer layer.

Example 13. The method of one of examples 9 to 12, further including: forming an input/output (I/O) structure for connecting the semiconductor chip to an external apparatus.

Example 14. The method of one of examples 9 to 13, further including: forming an underfill layer between the semiconductor chip and the conductive layer.

Example 15. The method of one of examples 9 to 14, further including: forming a passivation layer over a substrate of the semiconductor chip, and forming the buffer layer of the passivation layer.

Example 16. A semiconductor system including: a semiconductor chip comprising a RF circuit, a buffer layer over the RF circuit and a plurality of bumps over the buffer layer, wherein the plurality of bumps comprising at least one functional bump electrically connected to the RF circuit, and at least one dummy bump which is maintained at a distance from the RF circuit and prevented from being electrically connected to the RF circuit by the buffer layer, a conductive layer disposed over the semiconductor chip and coupled to the plurality of bumps through a plurality of vias, a feedline structure disposed over the conductive layer, wherein the feedline structure is electrically coupled to the RF circuit, and a plurality of antennas disposed over the feedline structure, wherein at least one antenna of the plurality of antennas is coupled to the RF circuit through the feedline structure.

Example 17. The semiconductor system of example 16, further including: a first UBM structure under the at least one functional bump, and a second UBM structure under the at least one dummy bump, wherein the first UBM structure and the second UBM structure are of a same thickness.

Example 18. The semiconductor system of one of examples 16 and 17, further including: an underfill layer between the semiconductor chip and the conductive layer, and a plurality of input/output pads electrically coupled to the conductive layer.

Example 19. The semiconductor system of one of examples 16-18, where the at least one functional bump is partially embedded in the buffer layer of the semiconductor chip, and the at least one dummy bump is over the buffer layer of the semiconductor chip.

Example 20. The semiconductor system of one of examples 16-19, where the feedline structure is at least partially surrounded by a metal shielding layer, and wherein the feedline structure is electrically coupled to the RF circuit through a via connected to a functional bump of the plurality of bumps.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
a radio frequency (RF) circuit;
a plurality of antennas;
a feedline structure for coupling at least one antenna of the plurality of antennas to the RF circuit;
an input/output (I/O) structure for connecting the semiconductor device to an external apparatus; and
a conductive layer connected to the I/O structure, wherein the semiconductor device further comprises:
a buffer layer arranged between the RF circuit and the conductive layer; and
a plurality of bumps disposed over the buffer layer and electrically connected to the conductive layer, the plurality of bumps comprising at least one functional bump electrically connected to the RF circuit, and at least one dummy bump which is maintained at a distance from the RF circuit and prevented from being electrically connected to the RF circuit by the buffer layer.

2. The semiconductor device of claim 1, further comprising:
a first under bump metallization (UBM) structure under the at least one functional bump; and
a second UBM structure under the at least one dummy bump, wherein the first UBM structure and the second UBM structure are formed of a same material.

3. The semiconductor device of claim 2, wherein:
the first UBM structure and the second UBM structure are of a same thickness.

4. The semiconductor device of claim 1, further comprising:
an underfill layer disposed between the buffer layer and the conductive layer.

5. The semiconductor device of claim 1, wherein:
the I/O structure comprises a first input/output pad and a second input/output pad electrically coupled to the conductive layer, and wherein the RF circuit is between the first input/output pad and the second input/output pad.

6. The semiconductor device of claim 1, wherein:
the conductive layer comprises a first opening, and wherein the feedline structure is electrically coupled to the RF circuit through a first via, and wherein the first via extends through the first opening.

7. The semiconductor device of claim 1, wherein:
the feedline structure is at least partially surrounded by a metal shielding layer.

8. The semiconductor device of claim 1, wherein:
a bottom surface of the at least one functional bump is lower than a bottom surface of the at least one dummy bump.

9. A method comprising:
forming a semiconductor chip comprising a radio frequency (RF) circuit, a buffer layer over the RF circuit, a plurality of bumps over the buffer layer, wherein the plurality of bumps comprising at least one functional bump electrically connected to the RF circuit, and at least one dummy bump separated from the RF circuit by the buffer layer;
forming a conductive layer over the semiconductor chip;
forming a plurality of vias coupled between the plurality of bumps and the conductive layer;
forming a feedline structure over the conductive layer; and
forming a plurality of antennas over the feedline structure, wherein at least one antenna of the plurality of antennas is coupled to the RF circuit through the feedline structure.

10. The method of claim 9, further comprising:
forming a metal shielding layer to at least partially surround the feedline structure.

11. The method of claim 9, further comprising:
forming a metal layer over the buffer layer of the semiconductor chip; and
patterning the metal layer to form a plurality of UBM structures including a first UBM structure under the at least one functional bump and a second UBM structure under the at least one dummy bump.

12. The method of claim 11, wherein:
the first UBM structure extends into the buffer layer; and
the second UBM structure is over the buffer layer.

13. The method of claim 9, further comprising:
forming an input/output (I/O) structure for connecting the semiconductor chip to an external apparatus.

14. The method of claim 9, further comprising:
forming an underfill layer between the semiconductor chip and the conductive layer.

15. The method of claim 9, further comprising:
forming a passivation layer over a substrate of the semiconductor chip; and
forming the buffer layer of the passivation layer.

16. A semiconductor system comprising:
a semiconductor chip comprising a RF circuit, a buffer layer over the RF circuit and a plurality of bumps over the buffer layer, wherein the plurality of bumps comprising at least one functional bump electrically connected to the RF circuit, and at least one dummy bump which is maintained at a distance from the RF circuit and prevented from being electrically connected to the RF circuit by the buffer layer;
a conductive layer disposed over the semiconductor chip and coupled to the plurality of bumps through a plurality of vias;
a feedline structure disposed over the conductive layer, wherein the feedline structure is electrically coupled to the RF circuit; and
a plurality of antennas disposed over the feedline structure, wherein at least one antenna of the plurality of antennas is coupled to the RF circuit through the feedline structure.

17. The semiconductor system of claim 16, further comprising:
a first UBM structure under the at least one functional bump; and
a second UBM structure under the at least one dummy bump, wherein the first UBM structure and the second UBM structure are of a same thickness.

18. The semiconductor system of claim 16, further comprising:
an underfill layer between the semiconductor chip and the conductive layer; and
a plurality of input/output pads electrically coupled to the conductive layer.

19. The semiconductor system of claim 16, wherein:
the at least one functional bump is partially embedded in the buffer layer of the semiconductor chip; and the at least one dummy bump is over the buffer layer of the semiconductor chip.

20. The semiconductor system of claim 16, wherein:
the feedline structure is at least partially surrounded by a metal shielding layer, and wherein the feedline structure is electrically coupled to the RF circuit through a via connected to a functional bump of the plurality of bumps.

\* \* \* \* \*